United States Patent
Matsudai et al.

(10) Patent No.: US 9,653,557 B2
(45) Date of Patent: May 16, 2017

(54) SEMICONDUCTOR DEVICE

(71) Applicant: KABUSHIKI KAISHA TOSHIBA, Tokyo (JP)

(72) Inventors: Tomoko Matsudai, Tokyo (JP); Yuichi Oshino, Tokyo (JP); Keiko Kawamura, Kanagawa (JP); Bungo Tanaka, Saitama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 231 days.

(21) Appl. No.: 14/195,784

(22) Filed: Mar. 3, 2014

(65) Prior Publication Data
US 2014/0374791 A1 Dec. 25, 2014

(30) Foreign Application Priority Data

Jun. 20, 2013 (JP) .................................. 2013-130029
Sep. 30, 2013 (JP) .................................. 2013-205884

(51) Int. Cl.
*H01L 29/00* (2006.01)
*H01L 29/40* (2006.01)
(Continued)

(52) U.S. Cl.
CPC ........ *H01L 29/404* (2013.01); *H01L 29/0619* (2013.01); *H01L 29/66068* (2013.01);
(Continued)

(58) Field of Classification Search
CPC ............. H01L 29/404; H01L 29/66068; H01L 29/66348; H01L 29/7397; H01L 29/0619;
(Continued)

(56) References Cited

U.S. PATENT DOCUMENTS 4,633,292 A 12/1986 Fellinger et al.
4,954,868 A 9/1990 Bergmann et al.
(Continued)

FOREIGN PATENT DOCUMENTS

CN 101859769 A 10/2010
CN 102544002 A 7/2012
(Continued)

OTHER PUBLICATIONS

Chinese Office Action dated Aug. 3, 2016, filed in Chinese counterpart Application No. 201410071801.7, 20 pages (with translation).

(Continued)

*Primary Examiner* — Kimberly Rizkallah
*Assistant Examiner* — Alexander Belousov
(74) *Attorney, Agent, or Firm* — Patterson & Sheridan, LLP

(57) ABSTRACT

A semiconductor device includes a first semiconductor region of a first conductivity type, a second semiconductor region having a second conductivity type, a first insulating layer on the first and second semiconductor regions, and field plate electrodes are provided in the first insulating layer at different distances from the first semiconductor layer. A first field plate electrode is at a first distance, a second field plate electrode is at a second distance greater than the first distance, and a third field plate electrode is at a distance greater than the second distance. The first through third field plate electrodes are electrically connected to each other and the third electrode is electrically connected to the second semiconductor region.

5 Claims, 19 Drawing Sheets

(51) Int. Cl.
- *H01L 29/66* (2006.01)
- *H01L 29/739* (2006.01)
- *H01L 29/06* (2006.01)
- *H01L 29/10* (2006.01)
- *H01L 29/16* (2006.01)
- *H01L 29/20* (2006.01)

(52) U.S. Cl.
CPC .... *H01L 29/66348* (2013.01); *H01L 29/7397* (2013.01); *H01L 29/0661* (2013.01); *H01L 29/1095* (2013.01); *H01L 29/1608* (2013.01); *H01L 29/2003* (2013.01)

(58) Field of Classification Search
CPC ............. H01L 29/0661; H01L 29/1095; H01L 29/1608; H01L 29/20
See application file for complete search history.

(56) References Cited

U.S. PATENT DOCUMENTS

| | | | |
|---|---|---|---|
| 5,311,052 A | 5/1994 | Stengl et al. | |
| 6,064,103 A | 5/2000 | Pfirsch | |
| 7,233,031 B2 | 6/2007 | Mauder et al. | |
| 8,994,141 B2 | 3/2015 | Takahashi et al. | |
| 2005/0161761 A1 | 7/2005 | Hatade | |
| 2012/0012929 A1 | 1/2012 | Saito et al. | |
| 2012/0153349 A1* | 6/2012 | Suzuki | H01L 23/4824 257/140 |
| 2014/0077261 A1 | 3/2014 | Oshino et al. | |

FOREIGN PATENT DOCUMENTS

| | | |
|---|---|---|
| JP | 2008187125 A | 8/2008 |
| JP | 2009-253126 A | 10/2009 |
| JP | 2012-018972 A | 1/2012 |
| JP | 2012023272 A | 2/2012 |

OTHER PUBLICATIONS

Japanese Office Action dated Nov. 4, 2016, filed in Japanese counterpart Application No. 2013-205884, 12 pages (with translation).

Japanese Office Action dated Aug. 19, 2016, filed in Japanese counterpart Application No. 2013-205884, 15 pages (with translation).

* cited by examiner

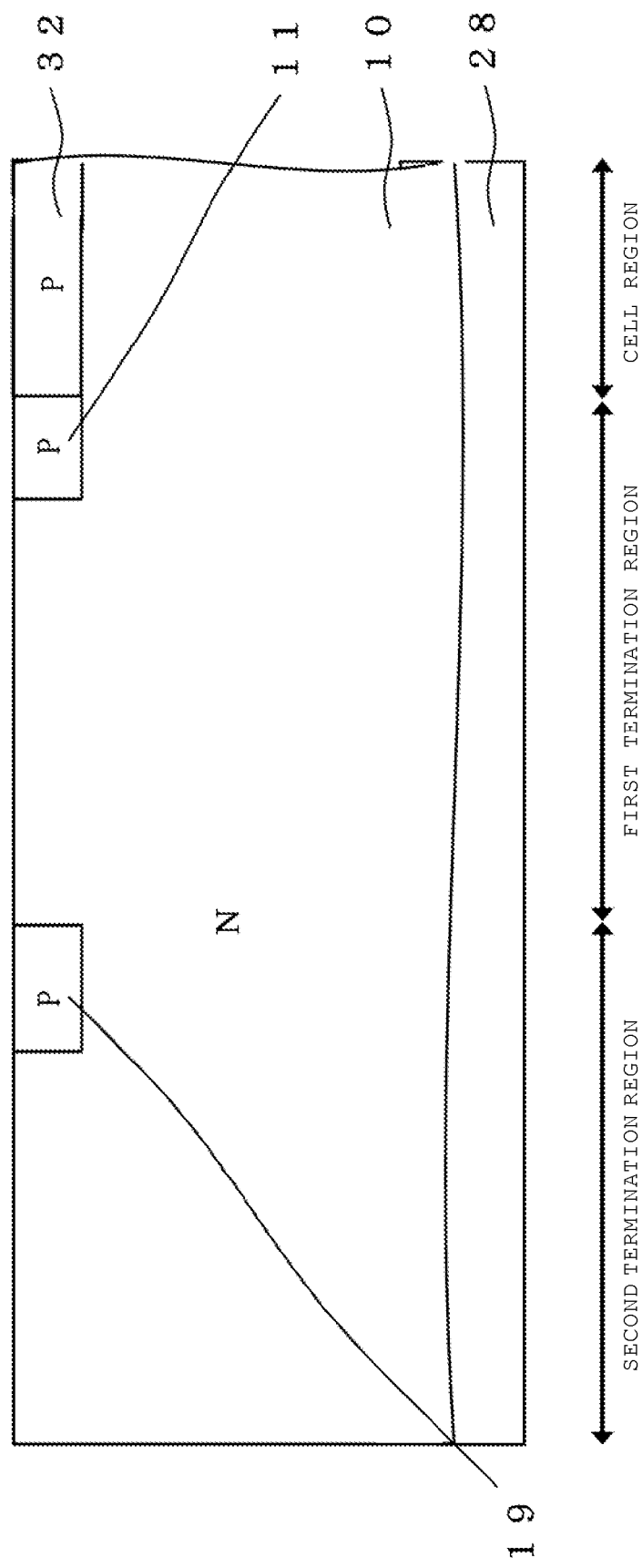

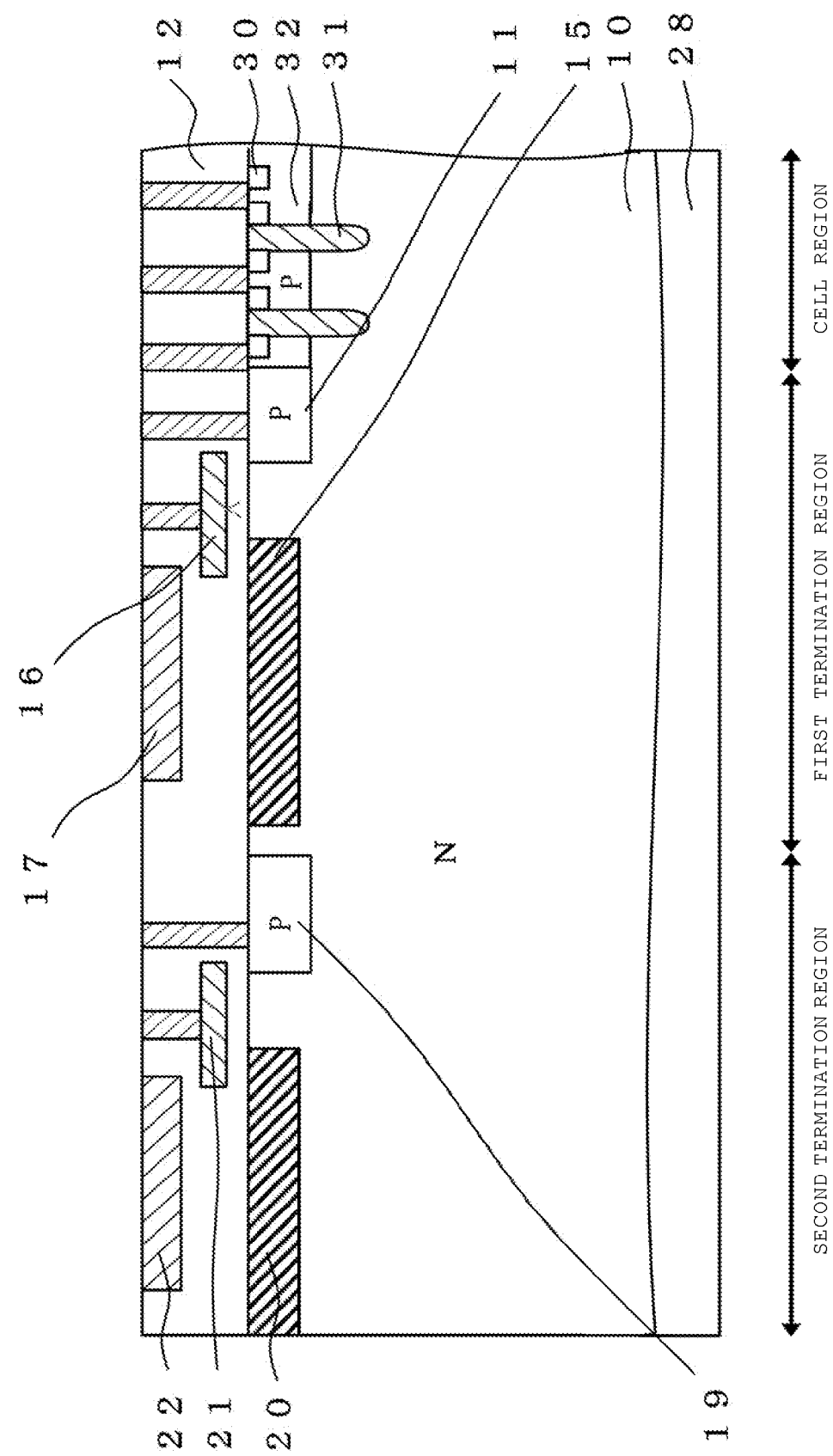

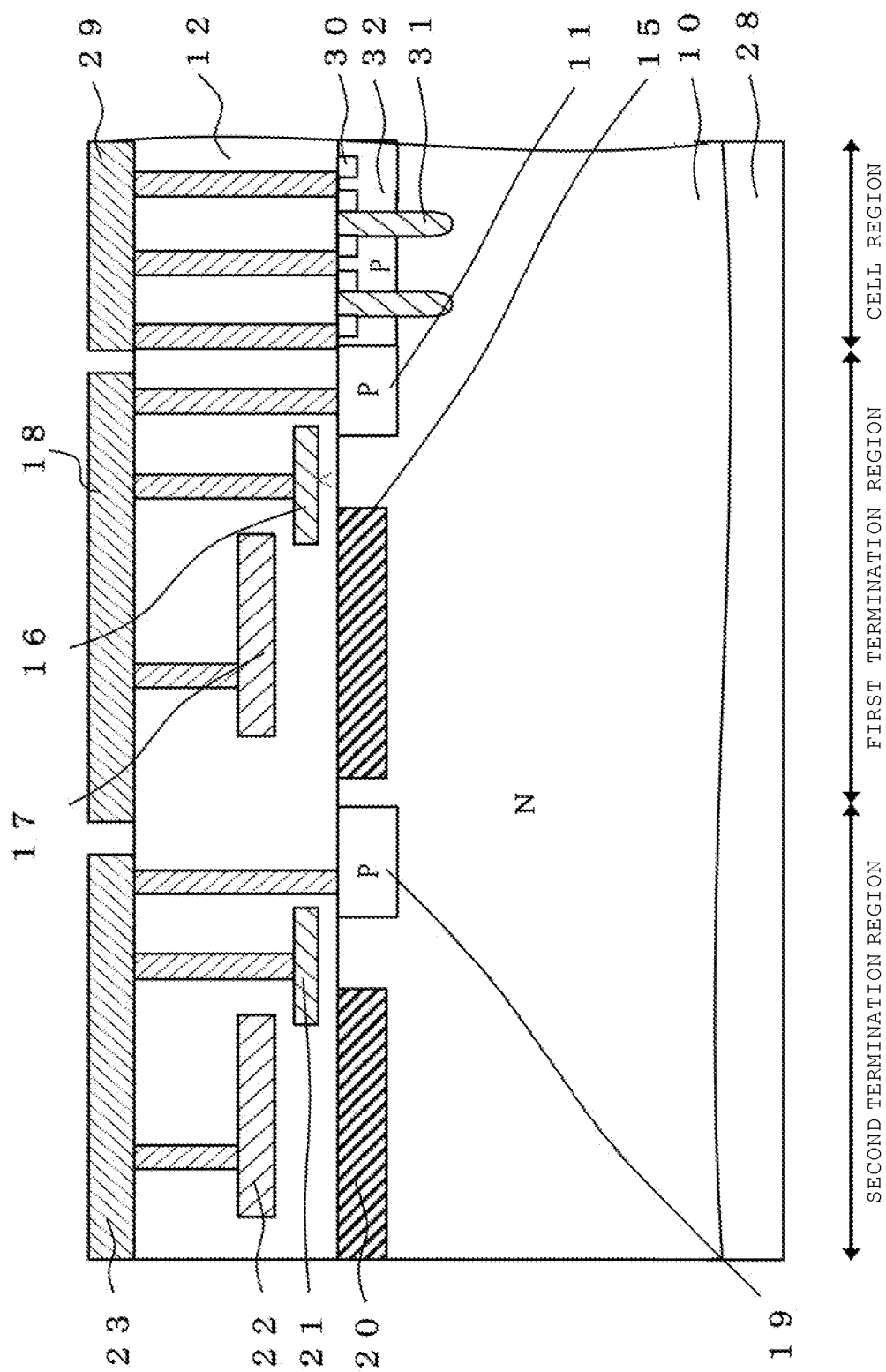

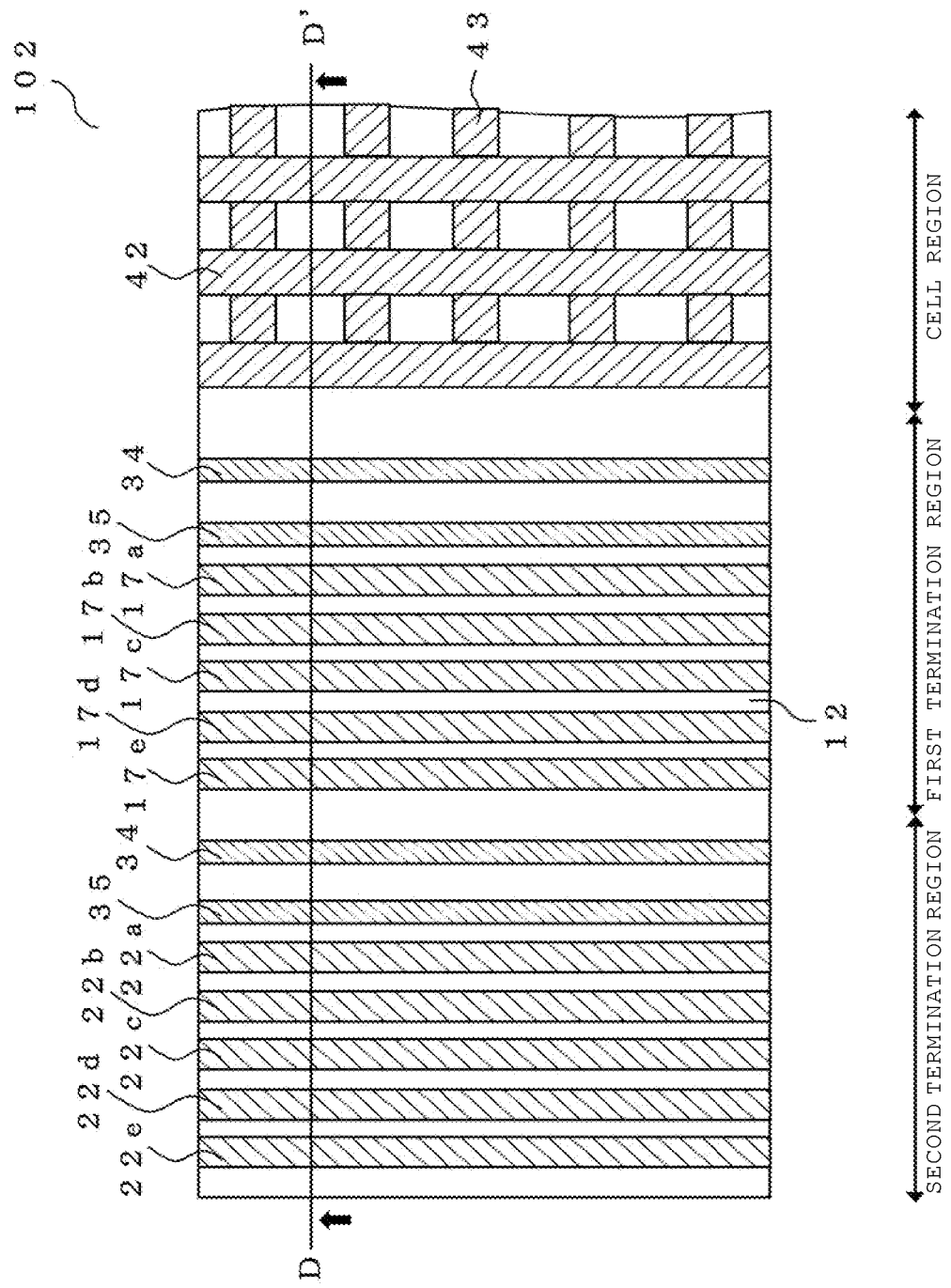

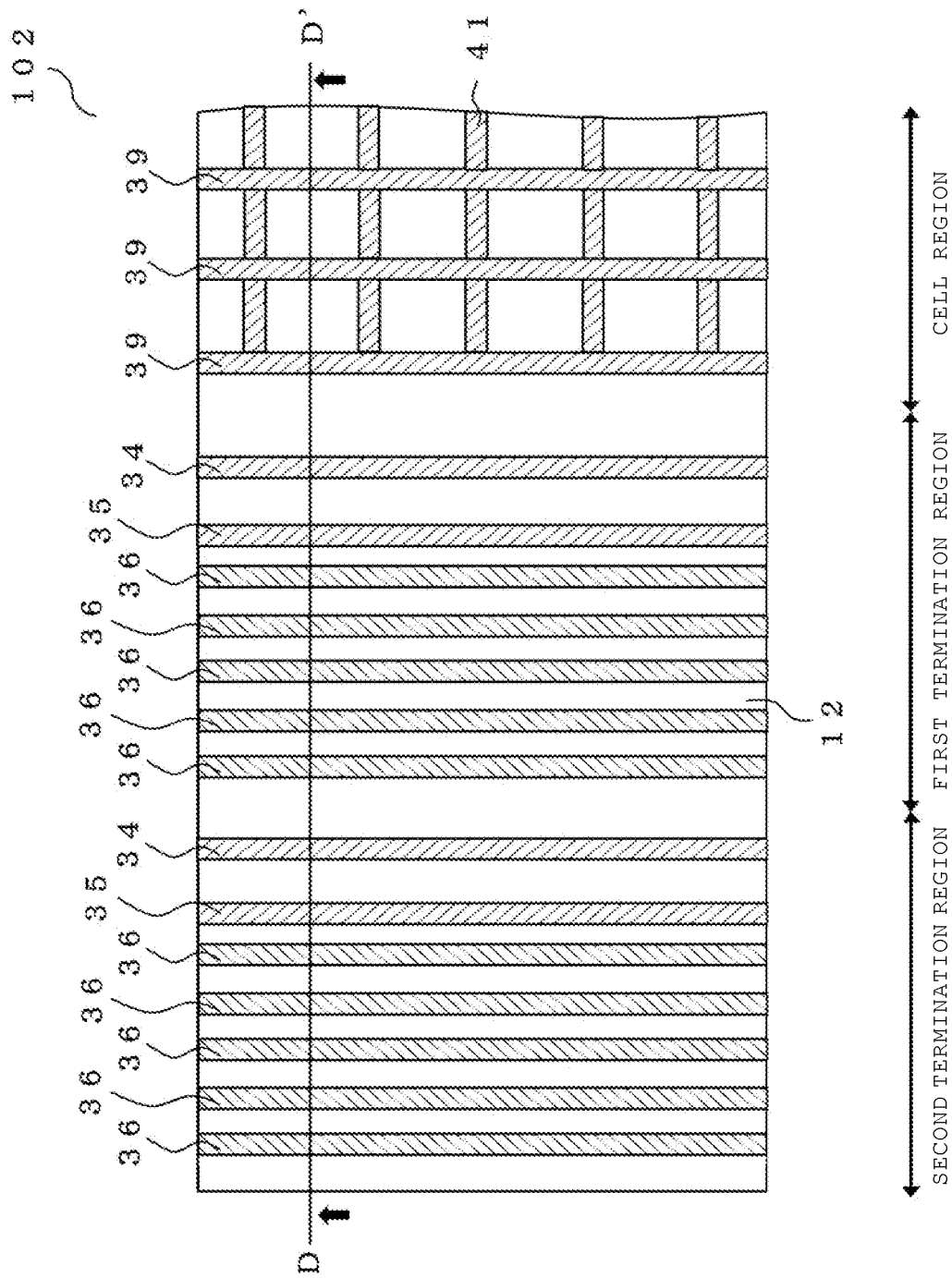

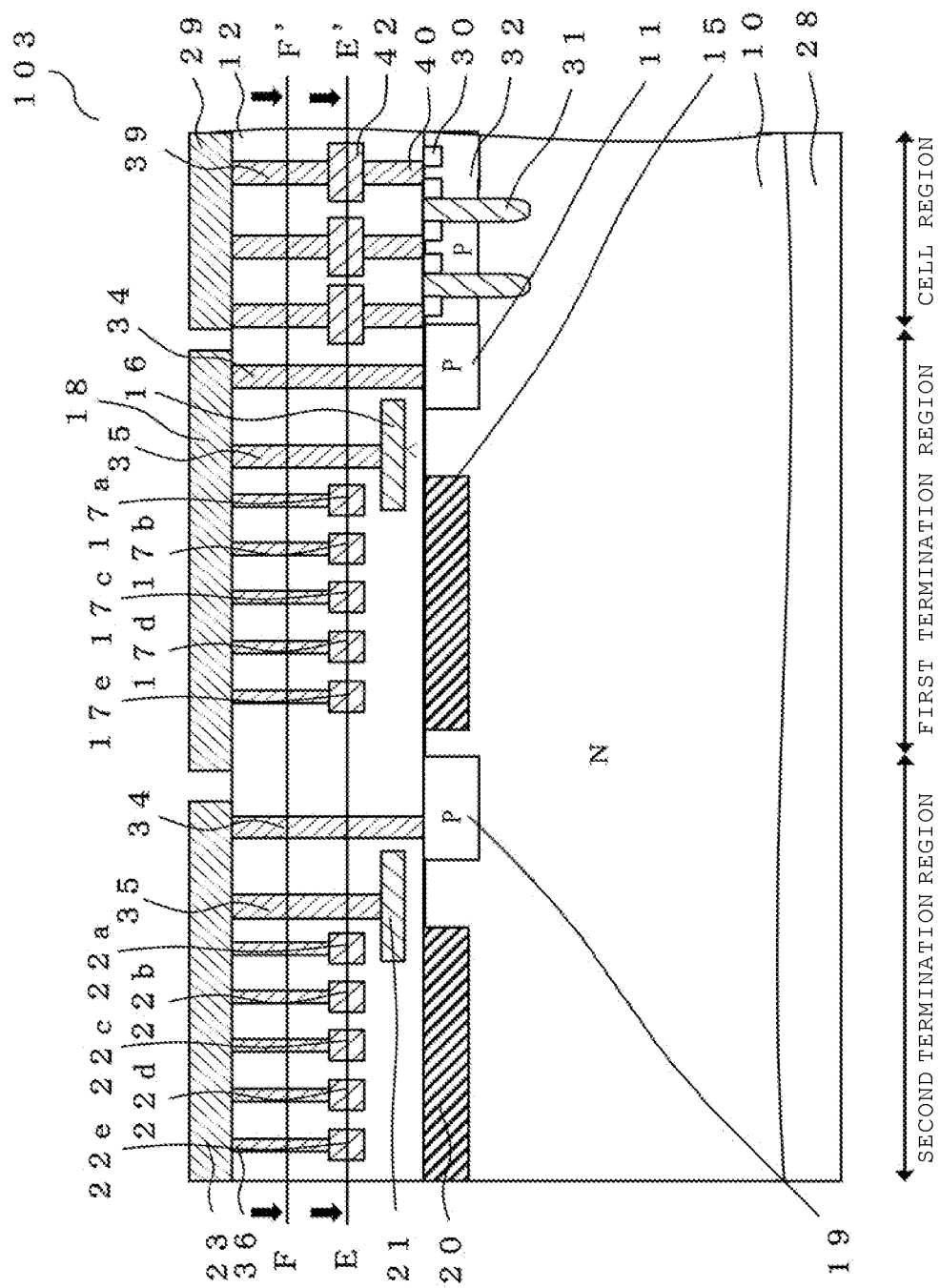

SEMICONDUCTOR DEVICE

CROSS-REFERENCE TO RELATED APPLICATION

This application is based upon and claims the benefit of priority from Japanese Patent Application No. 2013-130029, filed Jun. 20, 2013, and Japanese Patent Application No. 2013-205884, filed Sep. 30, 2013, the entire contents of which are incorporated herein by reference.

FIELD

Embodiments described herein relate generally to a semiconductor device.

BACKGROUND

An insulated gate bipolar transistor (IGBT) is used in low voltage household appliances and high-current, high-breakdown-voltage automotive and industrial apparatuses. An IGBT, in particular a vertical IGBT semiconductor device often needs to be designed to meet a specific breakdown voltage requirement. To achieve the desired breakdown voltage, a device termination region, a lateral doping structure (VLD), a reduced surface field (RESURF) structure, and a guard ring structure (FLR: Field Limiting Ring Structure) and the like are incorporated into the semiconductor device.

DESCRIPTION OF THE DRAWINGS

FIGS. 4A to 4F are schematic cross-sectional views of the semiconductor device during the manufacturing process of the semiconductor device according to the first embodiment.

FIG. 7 is a transverse cross-sectional view along line B-B' of FIG. 6.

FIG. 8 is a transverse cross-sectional view along line C-C' of FIG. 6.

FIG. 10 is a vertical cross-sectional view of the semiconductor device according to the third embodiment.

DETAILED DESCRIPTION

An object of an exemplary embodiment is to provide a semiconductor device having a termination structure in which a breakdown voltage may be increased.

In general, according to one embodiment, there is provided a semiconductor device that includes a first semiconductor region having a first conductivity type, a second semiconductor region having a second conductivity type, which is disposed on a first portion of a surface of the first semiconductor region, a first insulating layer on the first and second semiconductor regions, a first field plate electrode having a first portion at a first distance from the surface of the first semiconductor region in a first direction orthogonal to the surface, a second field plate electrode having at least a portion at a second distance greater than the first distance, from the surface of the first semiconductor region in the first direction, and a third field plate electrode having at least a portion at a third distance greater than the second distance, from the surface of the first semiconductor region in the first direction. The third field plate electrode is electrically connected to the second semiconductor region, the first field plate electrode, and the second field plate electrode.

Hereinafter, description will be given with regard to example embodiments with reference to drawings. Description of an example in which a first conductivity type is set as an N type and a second conductivity type is set as a P type, but it also possible for the types two be switched such that the first conductivity type is a P type and the second conductivity type is an N type.

(First Embodiment)

Figure 1:
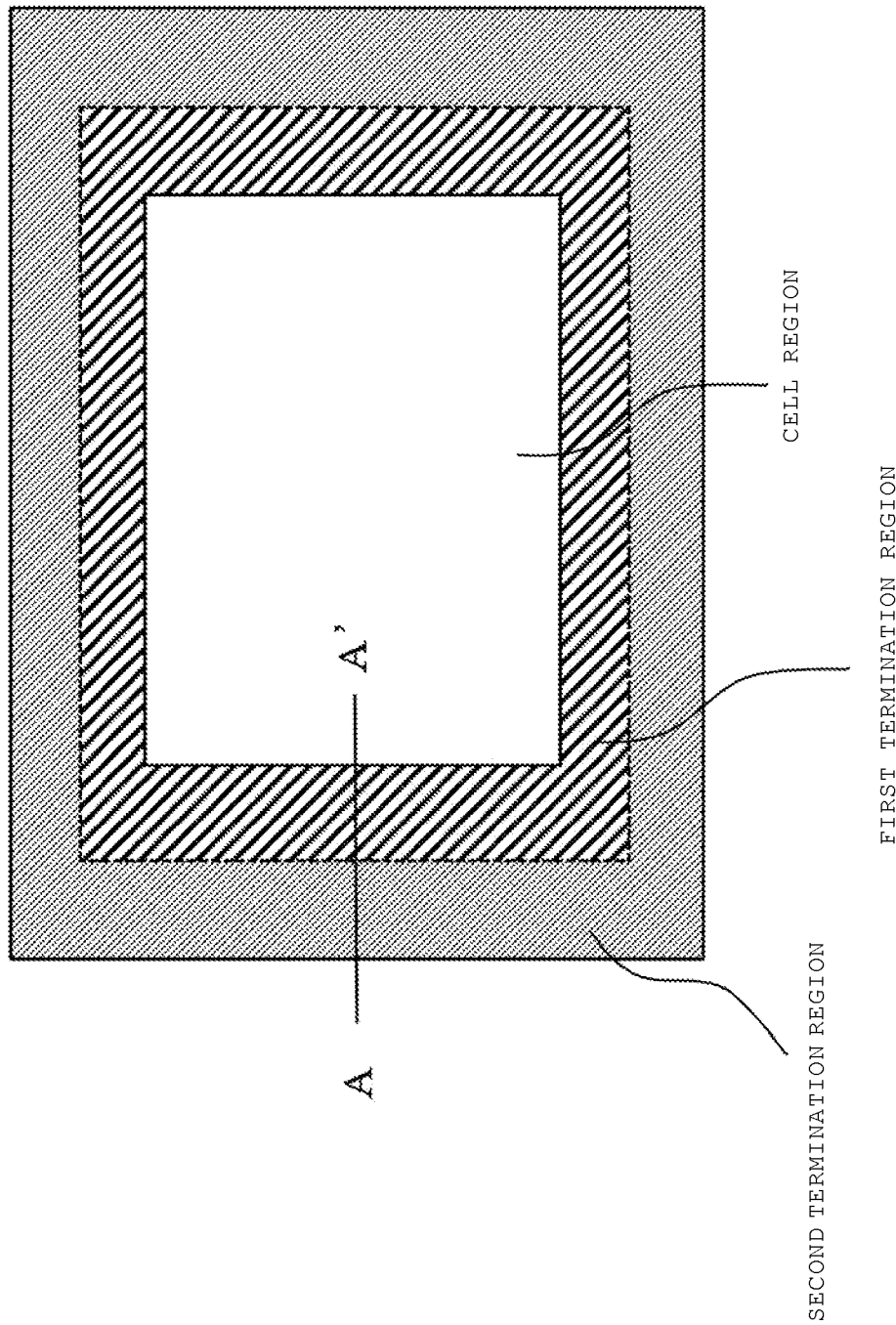
FIG. 1 is a schematic plan view of a semiconductor device according to a first embodiment.
Figure 2:
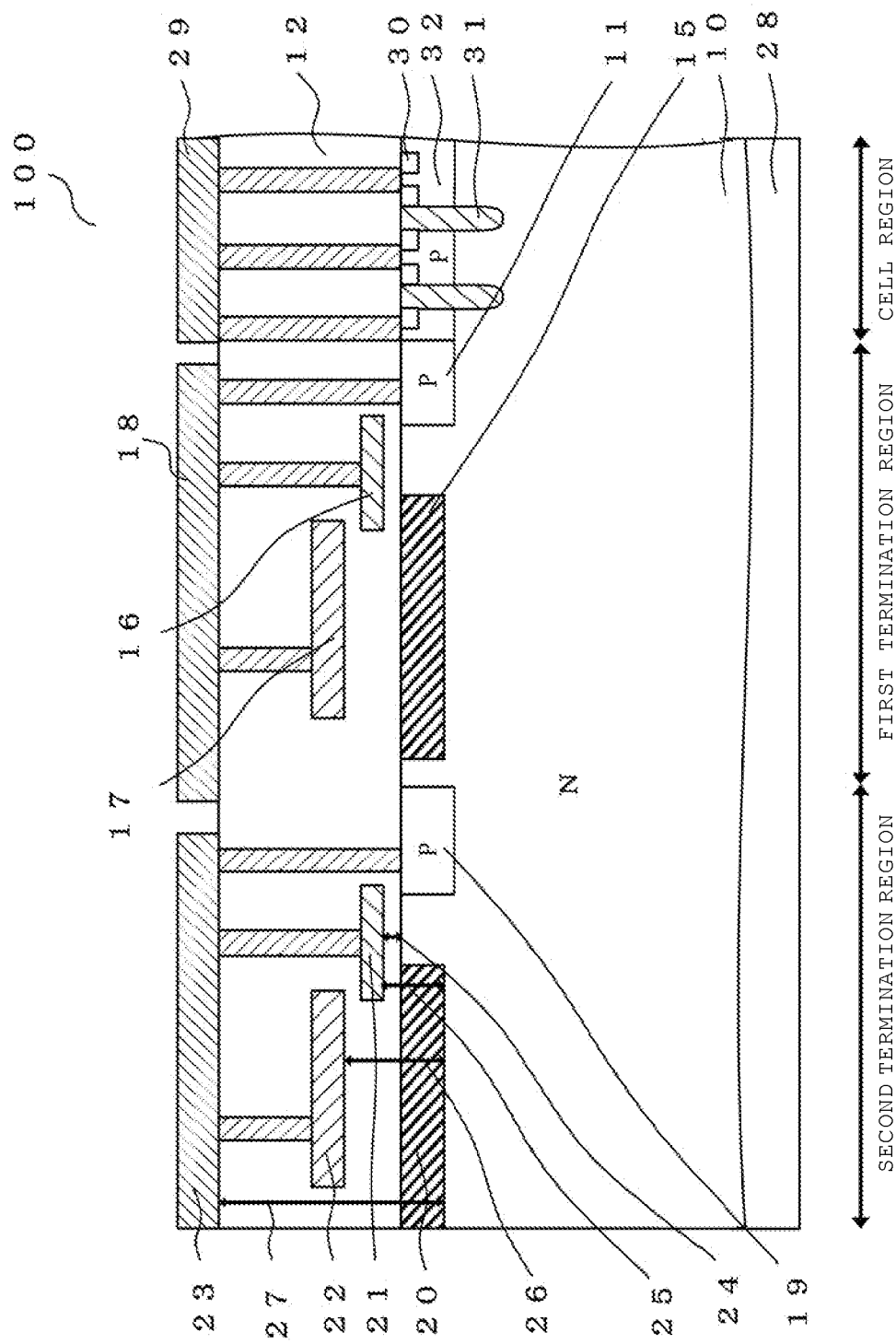
FIG. 2 is a vertical cross-sectional view along line A-A' of FIG. 1.

FIG. 1 is a plan view showing one example of a semiconductor device 100 according to a first embodiment, and a first termination region and a second termination region are provided on the exterior of a cell region where an insulated gate bipolar transistor (IGBT) is provided. FIG. 2 is a view showing a portion of a cross section taken along line A-A' of FIG. 1.

The semiconductor device 100 includes an N-type drift layer 10 (first semiconductor layer), P-type guard ring layers 11 and 19 (second semiconductor layer), a first insulating layer 12, second insulating layers 15 and 20, first field plate electrodes 16 and 21, second field plate electrodes 17 and 22, third field plate electrodes 18 and 23, a collector electrode 28, an emitter electrode 29, an N-type source layer 30, and a gate electrode 31, and a P-type body layer 32.

The first insulating layer 12 is provided in contact with the N-type drift layer 10. The collector electrode 28 is provided on aside of the N-type drift layer 10 that is opposite to the side on which the first insulating film 12 is provided. Thus, the first insulating layer 12 is disposed between collector electrode 28 and N-type drift layer 22. The P-type guard ring layers 11 and 19 and the P-type body layer 32 are provided in the N-type drift layer 10 and are contacting the first insulating layer 12. Upper surfaces of P-type guard ring layers 11 and 19 and the P-type body layer may have portions touching the first insulating layer 12. The p-type guard ring layer 11 is disposed between the p-type guard ring layer 19 and the cell region. The second insulating layers 15 and 20 are provided in the N-type drift layer 10 and are contacting the first insulating layer 12. First end of the gate electrode 31 is contacting the first insulating layer 12 and a second end of the gate electrode 31 is in the N-type drift layer 10. That is, gate electrode 31 extends from a surface contacting the first insulating layer 12 into the N-type drift layer 10. The N-type source layer 30 is provided in contact with the first insulating layer 12 and. The N-type source layer 30 is disposed at a level that is between the first insulating layer 12 and the N-type drift layer 10. Gate electrode 31 extends between portions of the N-type source layer 30. Gate electrode 31 extends through P-type body layer 32 into the N-type drift layer 10.

For the N-type drift layer 10 silicon (Si), silicon carbide (SiC), or gallium nitride (GaN) or the like may be used, for example.

For the first insulating layer 12 an insulating film such as silicon oxide ($SiO_2$), phosphorus silicon glass (PSG), boron phosphorus silicon glass (BPSG), and tetraethyl orthosilicate (TEOS) or the like, may be used for example. The first insulating layer 12 may be formed by chemical vapor deposition (CVD) or thermal oxidation or any other available technique.

The first field plate electrodes 16 and 21 are provided in the first insulating layer 12 such that a distance from the N-type drift layer 10 is the distance labeled "24," as depicted in FIG. 2. The distance labeled "24" is the distance between a bottom surface of each first field plate electrode 16 and 21 and an upper surface of N-type drift layer 10. First field plate electrodes 16 and 21 may be provided in a planar shape as depicted in FIG. 2. Additionally, the first field plate electrode 16 partially overlaps the P-type guard ring layer 11 and the second insulating layer 15. That is, if viewed from above, the field plate electrode 16 would cover a portion of the P-type guard ring layer 11 and the second insulating layer 15. The first insulating layer 12 is disposed between the first field plate electrode 16 and the P-type guard ring layer 11 and between the first field plate electrode 16 and the second insulating layer 15. The first field plate electrode 21 partially overlaps the P-type guard ring layer 19 and the second insulating layer 20. That is, if viewed from above, the first field plate electrode 21 would cover a portion of the P-type guard ring layer 19 and the second insulating layer 20. The first insulating layer 12 is disposed between the first field plate electrode 21 and the P-type guard ring layer 19 and between the first field plate electrode 21 and the second insulating layer 20.

The second field plate electrodes 17 and 22 are disposed in the first insulating layer 12 such that a distance from an upper surface of the N-type drift layer 10 to a bottom surface of the second field plate electrodes 17 and 22 is a distance labeled "26" in FIG. 2. The second field plate electrode 17 is further away from the cell region than the first field plate electrode 16 and partially overlaps the first field plate electrode 16. The second field plate electrode 17 also partially overlaps the second insulating layer 15. That is, if viewed from above, the second field plate electrode 17 would cover a portion of the first field plate electrode 16 and a portion of the second insulating layer 15. The first insulating layer 12 is disposed between the second field plate electrode 17 and the second insulating layer 20 and between the second field plate electrode 17 and the first field plate electrode 16.

The second field plate electrode 22 is further away from the cell region than the first field plate electrode 21 and partially overlaps the first field plate electrode 21. The second field plate electrode 22 also partially overlaps the second insulating layer 20. That is, if viewed from above the second field plate electrode 22 would cover a portion of the first field plate electrode 21 and a portion of the second insulating layer 20. The first insulating film is disposed between the second field plate electrode 22 and the first field plate electrode 21 and between the second field plate electrode 22 and the second insulating film 20.

The second field plate electrode 17 and the second field plate electrode 22 may have flat planar shapes.

The third field plate electrodes 18 and 23 are disposed such that a distance between a bottom surface of the third field plate electrodes 18 and 23 and an upper surface of the N-type drift layer 10 is the distance labeled "27" in FIG. 2.

The third field plate electrode 18 is disposed at a level that is above the second field plate electrode 17 and overlaps the second field plate electrode 17 and also overlaps the second insulating layer 15. That is, if viewed from above, the at least a portion of the third field plate electrode 18 would cover the first field plate electrode 16 and the second field plate electrode 17. The third field plate electrode 23 is at a level above the second field plate electrode 22 and overlaps the second field plate electrode 22 and the second insulating layer 20. That is, if viewed from above, at least a portion the third field plate electrode 23 covers the second field plate electrode 22 and the second insulating layer 20.

The field plate electrodes 16 and 21 may be comprised of polysilicon or the like, in some embodiments. The second field plate electrodes 17 and 22 and the third field plate electrodes 18 and 23 may comprise low-resistance metal such as tungsten (W), copper (Cu), molybdenum (Mo), aluminum (Al), ruthenium (Ru), or the like.

The P-type guard ring layer 11, the first field plate electrode 16, the second field plate electrode 17, and the third field plate electrode 18 are connected to an emitter potential. In addition, the P-type guard ring layer 19, the first field plate electrode 21, the second field plate electrode 22, and the third field plate electrode 23 are electrically connected to each other, and have floating potentials.

Figure 3:
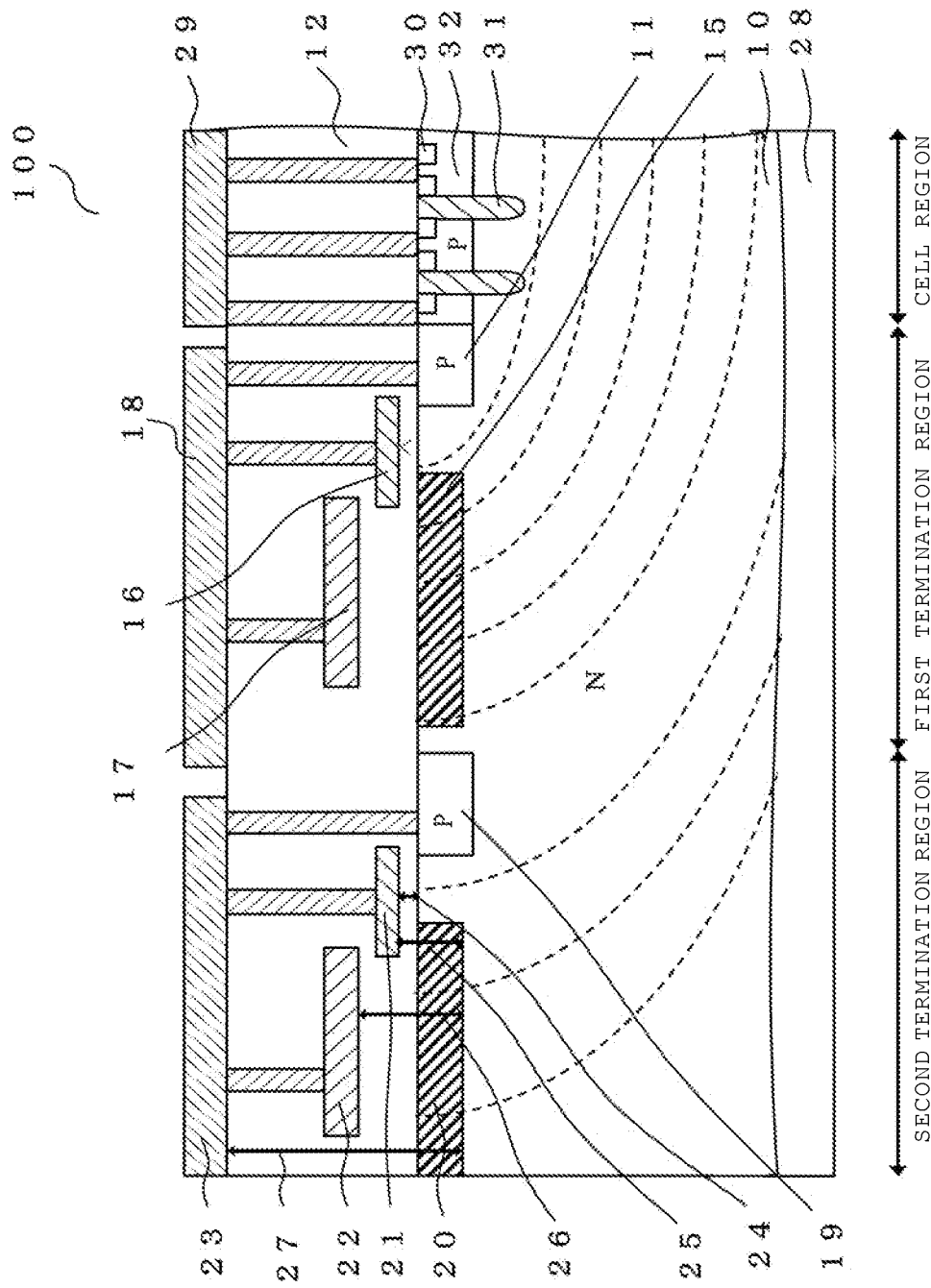
FIG. 3 is a schematic cross-sectional view depicting an expansion of a depletion layer in the semiconductor device of FIG. 2.

Next, description will be given of an operation of semiconductor device 100. FIG. 3 is a view schematically depicting an expansion of a depletion layer of the semiconductor device 100 according to the first embodiment. When a high voltage is applied to the collector electrode 28, the depletion layer expands from a PN junction interface between the P-type body layer 32 and N-type drift layer 10 in the cell region. When the expansion of the depletion layer reaches the P-type guard ring layer 11, which is electrically connected to the emitter potential and provided in the first termination region on the exterior of the cell region, the depletion layer expands by including the PN junction interface between the P-type guard ring layer 11 and the N-type drift layer 10.

Since the N-type drift layer 10 and the first field plate electrode 16, which is connected to the emitter potential, are opposed to each other across a portion of the first insulating layer 12 that is on the exterior of the P-type guard ring layer 11 in the first termination region and has a thickness equal to distance 24, the depletion layer expands to the N-type drift layer 10, which is under the first field plate electrode 16.

Further from the cell region, the N-type drift layer 10 and the first field plate electrode 16 are separated from each other by the first insulating layer 12 and the second insulating layer 15. The combined thickness of the first insulating layer 12 and the second insulating layer 15 underneath the first field plate electrode 16 is equal to the distance "25." That is, first field plate electrode 16 has a portion that is separated from the N-type drift layer 10 by the distance "25." The N-type drift layer 10 and the second field plate electrode 17, which is connected to the emitter potential, are separated from each other by the second insulating layer 15 and the first insulating layer 12 at distance "26." The N-type drift layer 10 and the third field plate electrode 18, which is connected to the emitter potential have at least some portions that are separated from each other by the second insulating layer 15 and the first insulating layer 12 at a distance "27." In some embodiments, some portions of the third field plate electrode may be separated from the N-type drift layer 10 by the overall thickness of the first insulating layer 12.

In this manner, since the respective distance between the first to third field plate electrodes and the N-type drift layer 10 generally increases (e.g., from distance "24" to distance "27") with increasing distance from the cell region, the potential gradient is moderate (not steep) in the first termination region and the depletion layer, expands by including the PN junction interface between the P-type guard ring layer 11 and the N-type drift layer 10 into the first termination region in a direction away from the cell region.

When the depletion layer reaches the second termination region disposed beyond the first termination region in a direction away from the cell region, the depletion layer expands to include the PN junction interface between the P-type guard ring layer 19. Since the N-type drift layer 10 and the first field plate electrode 21 are opposed to each other via the first insulating layer 12 at the distance "24", the depletion layer expands in to the N-type drift layer 10 region which is under the first field plate electrode 21.

Portions of the N-type drift layer 10 and the first field plate electrode 21 are separated from each other by the first insulating layer 12 and the second insulating layer 20 at the distance "25." The N-type drift layer 10 and the second field plate electrode 22 are separated from each other by the second insulating layer 20 and the first insulating layer 12 at a distance "26." The N-type drift layer 10 and the third field plate electrode 23 have portions that are separated from each other by the second insulating layer 20 and the first insulating layer 12 at a distance "27."

In this manner, since the respective distance between the first to third field plate electrodes and the N-type drift layer 10 increases (e.g., from distance "24" to distance "27") with increasing distance from the cell region, the potential gradient in a direction away from the cell region becomes moderate (less steep) in the second termination region, the depletion layer also expands into the second termination region in a direction away from the cell region.

Next, description will be given with regard to the effects of the semiconductor device 100. The depletion layer expands from the PN junction interface between the P-type body layer 32 and the N-type drift layer 10 in the cell region to the PN junction interface between the P-type guard ring layer 11 (connected to the emitter potential) in the first termination region and the N-type drift layer 10.

The depletion layer subsequently expands to the second termination region, and the depletion layer expands from the PN junction interface between the P-type guard ring layer 19 (which is in a floating state) and the N-type drift layer 10.

Since the potential gradient becomes moderate owing to the first termination region including a field plate connected to the emitter potential and the second termination region including a field plate in a floating state, it is possible to obtain a high breakdown voltage in the termination region.

When the field plate is not flat but step-like, there is a possibility that disconnection of the field plate film may occur. In such cases, it is necessary to thicken the field plate film so as to prevent the disconnection. However, it is possible to reduce the thickness of the field plate film without causing the disconnection of the field plate film, as well as reduce the thickness of the entire element by providing the flat field plate. In addition, since a material for each field plate film on the flat field plate may be different, it is possible to extend a material selection range.

Next, description will be given of a method of manufacturing the semiconductor device 100. FIGS. 4A to 4F are cross-sectional views showing a cross-sectional structure during stages of the manufacturing process of the semiconductor device 100 according to the first embodiment.

Figure 4B:
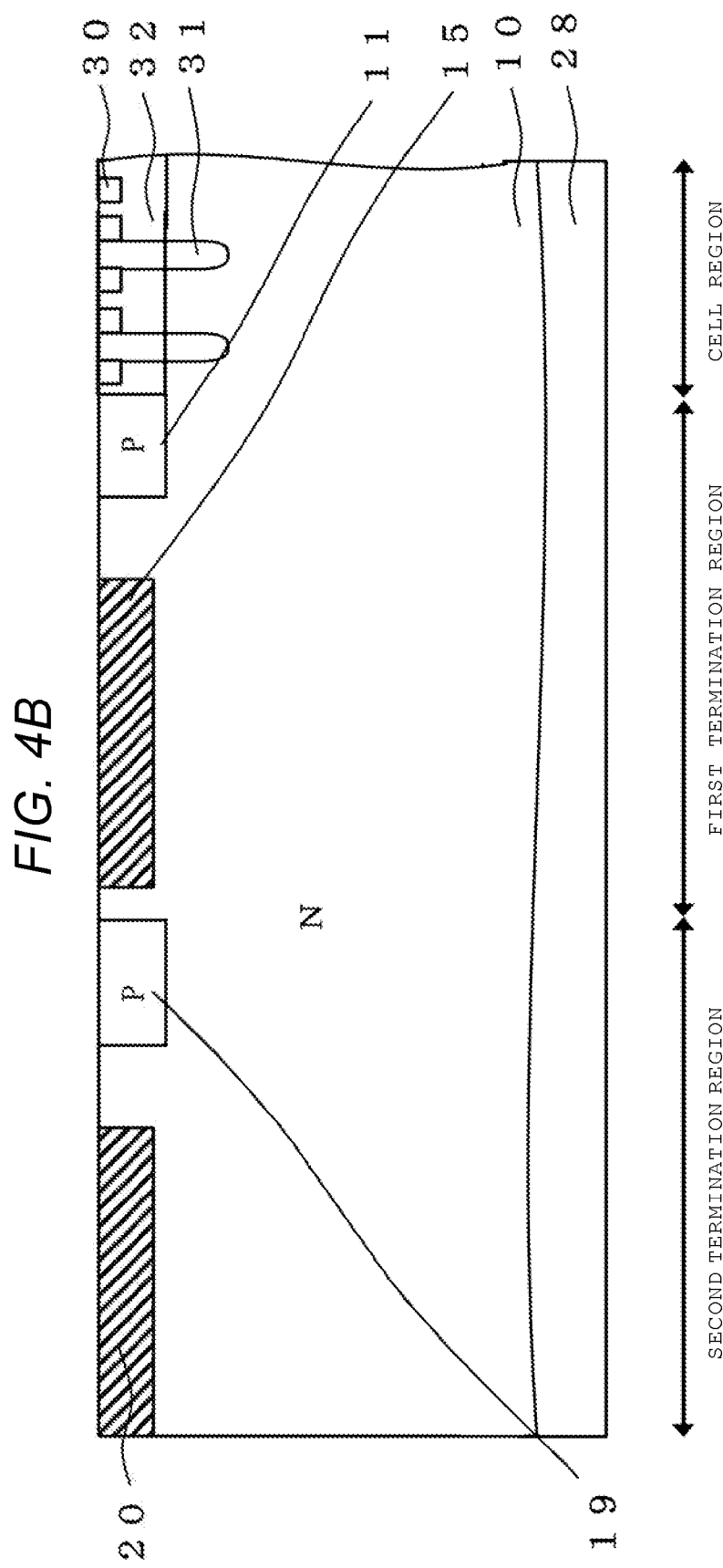

First, as shown in FIG. 4A, P-type guard ring layers 11 and 19 and P-type body layer 32 are formed by selectively injecting boron (B), which is a P-type dopant, or the like into a surface of the N-type drift layer 10 by an ion injection method using a photoresist layer (not specifically depicted) as a mask. Next, as shown in FIG. 4B, the second insulating layers 15 and 20 are formed on the surface of the N-type drift layer 10 by, for example, a thermal oxidation method, such as, for example, LOCOS (localized oxidation of silicon) oxidation, or the like. A chemical vapor deposition (CVD) method or similar technique can also be used to deposition insulating material into a groove/recess previously formed in the N-type drift layer 10. Then, the second insulating layers 15 and 20 are selectively etched using a photoresist, or the like, as an etch mask such that the second insulating layers 15 and 20 are formed in a desired location. In addition, a trench, which is later filled with a conductive material that becomes the gate electrode 31, is formed by an etch process.

In this embodiment, the first insulating layer 12 is formed by either the thermal oxidation method or the CVD method, and the layers of the first field plate electrodes 16 and 21 and the gate electrode 31 are formed by deposition of polysilicon, or the like. The first field plate electrodes 16 and 21 are selectively etched by a reactive ion etching (RIE) method and the like, with a photoresist, or the like, as an etch mask position such that the first field plate electrodes 16 and 21 are formed in a desired location.

Figure 4C:
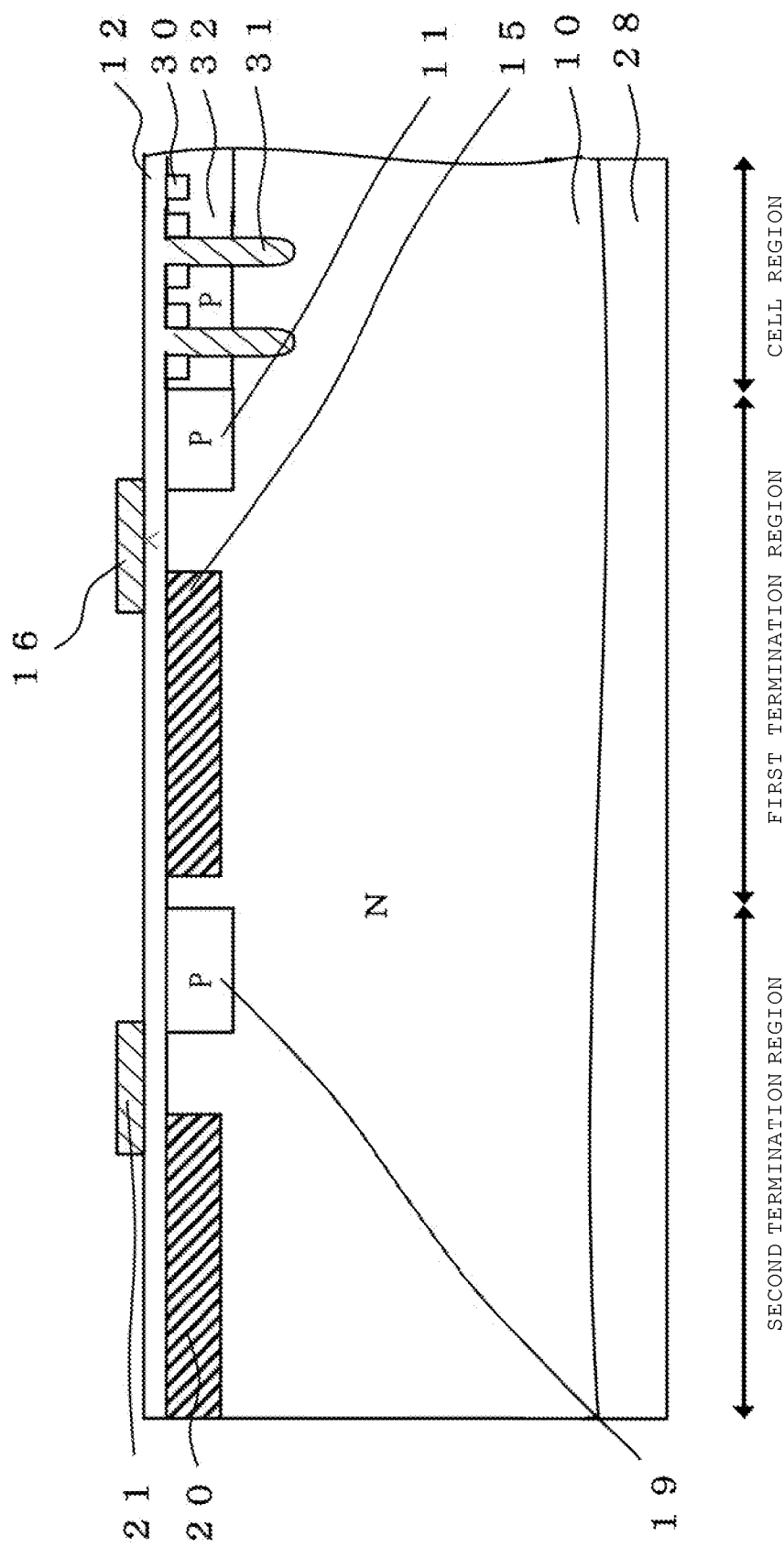

N-type source layer 30 is formed and the intermediate shape depicted FIG. 4C can obtained by selectively injecting phosphorus or arsenic (As), which are an N-type dopants, or the like, by an ion injection method.

The first insulating layer 12 can be formed by the CVD method, or the like. Through-holes (vias) are formed for making electrical connections in a vertical direction between various elements are formed as depicted through first insulating film 12. For example, a through-hole between third field plate electrode 23 and second field plate electrode 22 is formed in the first insulating film 12 before formation of the third field plate electrode 23. A through-hole in the first insulating film 12 is formed to make a connection between third field plate electrode 18 and P-type guard ring layer 11, between third field plate electrode 18 and first field plate electrode 16, and between third field plate electrode 18 and the second field plate electrode 17. Similarly, a through-hole is formed for making a connection between third field plate electrode 23 and P-type guard ring layer 19, between third field electrode 23 and first field plate electrode 21, and between third field plate electrode 23 and second field plate electrode 22. Additionally, through-holes are made in the first insulating layer 12 for making electrical connection between emitter electrode 29 and elements in the cell region such as P-type body layer 32. Through-holes may formed by a RIE method or the like, with a photoresist as the mask.

As depicted in FIG. 4D, a low-resistance metal is embedded to the second field plate electrodes 17 and 22 and the through-holes by a CVD method or other deposition method. The upper surface of the deposited metal can be flattened by a chemical mechanical polishing (CMP) method, or the like.

The first insulating layer 12 in this example is formed by the CVD method or the like.

Figure 4E:
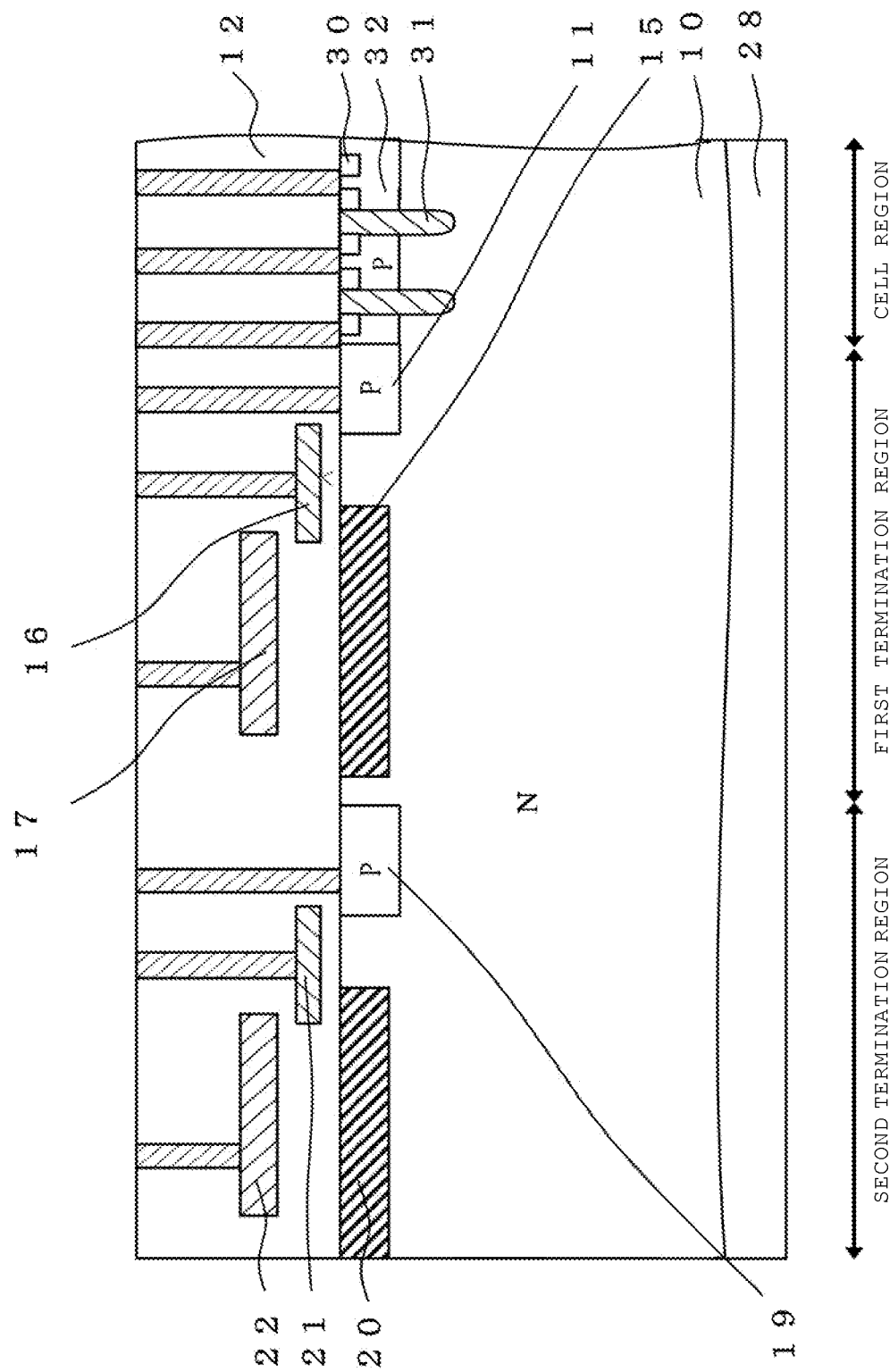

As depicted in FIG. 4E, a low-resistance metal is embedded in the through-hole by the CVD method, or the like and an upper surface of the deposited metal may be subsequently flattened by a chemical mechanical polishing (CMP) method, or the like.

The layers of the third field plate electrodes 18 and 23 and the emitter electrode 29 are, in this example, formed by a sputtering method, or the like. The third field plate electrodes 18 and 23 and the emitter electrode 29 are selectively etched by a RIE method, or the like, using a photoresist as the mask, and the shape shown in FIG. 4F is obtained such that the third field plate electrodes 18 and 23 and the emitter electrode 29 remain in a desired location.

The above-described manufacturing method is merely an example, and for example, the film forming method may be implemented by an atomic layer deposition (ALD) method, in which growth may be performed a single atomic layer at a time, or a vacuum deposition method, a coating method, and a spraying method in addition to the CVD method.

(Second Embodiment)

Description will be given with regard to a second embodiment using FIG. 5. Moreover, with regard to the second embodiment, description with regard to the similar elements as the first embodiment may be omitted, and additional description will be given with regard to only points of difference.

Figure 5:
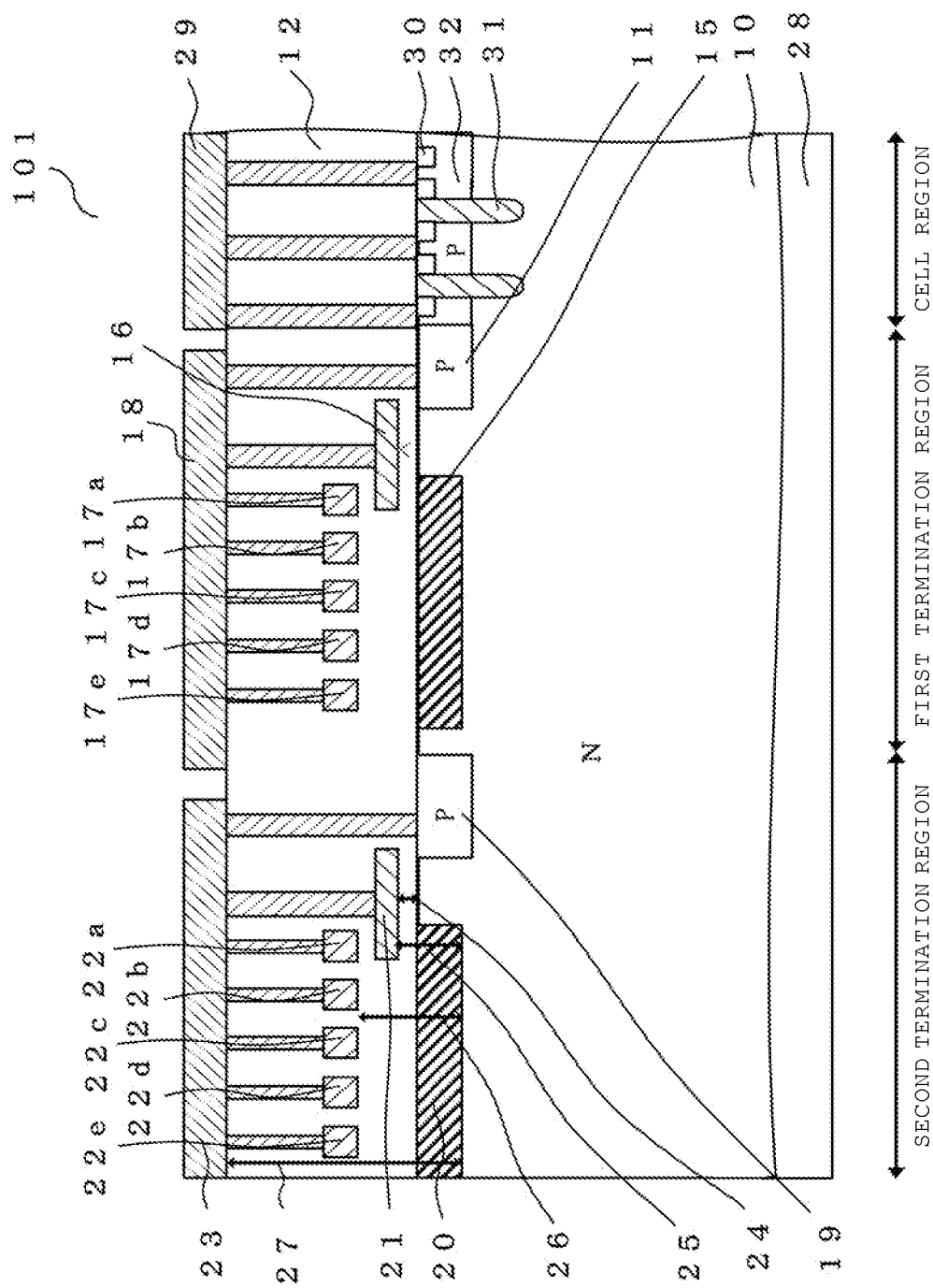
FIG. 5 is a vertical cross-sectional view of a semiconductor device according to a second embodiment.

FIG. 5 is a cross-sectional view showing an example of a configuration of a semiconductor device 101 according to the second embodiment and shows the termination region provided on the exterior of the cell region where the IGBT element is provided.

Different points of the semiconductor device 101 from the semiconductor device 100 according to the first embodiment are that a plurality of field plate electrodes are separated, and a plurality of field plate electrodes, in which distance from the N-type drift layer 10 is the same, are provided in the first termination region and the second termination region. For example, as depicted the second field plate electrodes 17 and 22 are each provided as five separated portions, the second field plate electrodes 17 and 22 become the second field plate electrodes 17a, 17b, 17c, 17d, 17e, 22a, 22b, 22c, 22d, and 22e, respectively. The second field plate electrodes 17a, 17b, 17c, 17d, and 17e provided in the first termination region are each connected to the emitter potential. The second field plate electrodes 22a, 22b, 22c, 22d, and 22e provided in the second termination region are in floating states.

These second field plate electrodes 17a to 17e and 22a to 22e may have the same width or may have different widths. In addition, an interval between the second field plate electrodes 17a to 17e (or 22a to 22e) may be longer or shorter than the width of the individual second field plate electrodes 17a to 17e (or 22a to 22e). In addition, it is not necessary for each second field plate electrode 17a to 17e (or 22a to 22e) that are adjacent to each other to be completely separated from each other—that is, there may be a region in which the field plate electrodes are separated and a region in which the field plate electrodes are not separated. Other structures are similar to those of the semiconductor device 100 according to the first embodiment.

Next, description will be given with regard to the operations of the semiconductor device 101. There is an effect that the potential gradient in the terminal direction of the element from the cell region becomes moderate (less steep) by dividing each of the second field plate electrodes 17 and 22 into separate portions. The field plate generates electric field concentration at the end portion regardless of the size at the end portion. The field plate creates a small electric field peak at its end portion but by arranging the field plates in several discrete portions, the generating of a large electric field concentration in one place may be avoided because the plurality of the field plates have a narrower width than the single field plate spanning the same distance as the plurality of field plates. Accordingly, the depletion layer expands from the PN junction interface between the P-type body layer 32 and the N-type drift layer 10 in the cell region to the N-type drift layer 10, in a stepwise manner, and expands from the PN junction interface between the P-type guard ring layer 19 in the second termination region and the N-type drift layer 10 to the N-type drift layer 10, which is directly under the first to third field plate electrodes, in a stepwise manner.

In the semiconductor device 101 the depletion layer expands from the PN junction interface between the P-type body layer 32 and the N-type drift layer 10 in the cell region to the PN junction interface between the P-type guard ring layer 11 in the first termination region and the N-type drift layer 10 and the first field plate electrode 16, the second field plate electrodes 17a, 17b, 17c, 17d, and 17e, and the third field plate electrode 18, that is, from the cell region to the first termination region in a stepwise manner.

Next, the depletion layer expands from the PN junction interface between the P-type guard ring layer 19 in the second termination region and the N-type drift layer 10 to the first field plate electrode 21, the second field plate electrode 22a, 22b, 22c, 22d, and 22e, and the third field plate electrode 23, that is, from the first termination region to the second termination region in a stepwise manner.

Since the electric field concentration is generally suppressed without generating the large electric field concentration in one place, it is possible to obtain a high breakdown voltage in the termination region. It may be possible to reduce the thickness of the device element because the possible material selection range is expanded since the material may be changed for each field plate in a manner similar to the semiconductor device 100.

(Third Embodiment)

Hereinafter, description will be given to a third embodiment using FIG. 6. Moreover, with regard to the third embodiment, description with regard to the same points as the second embodiment will be omitted, and description will be given with regard to only different points.

Figure 6:
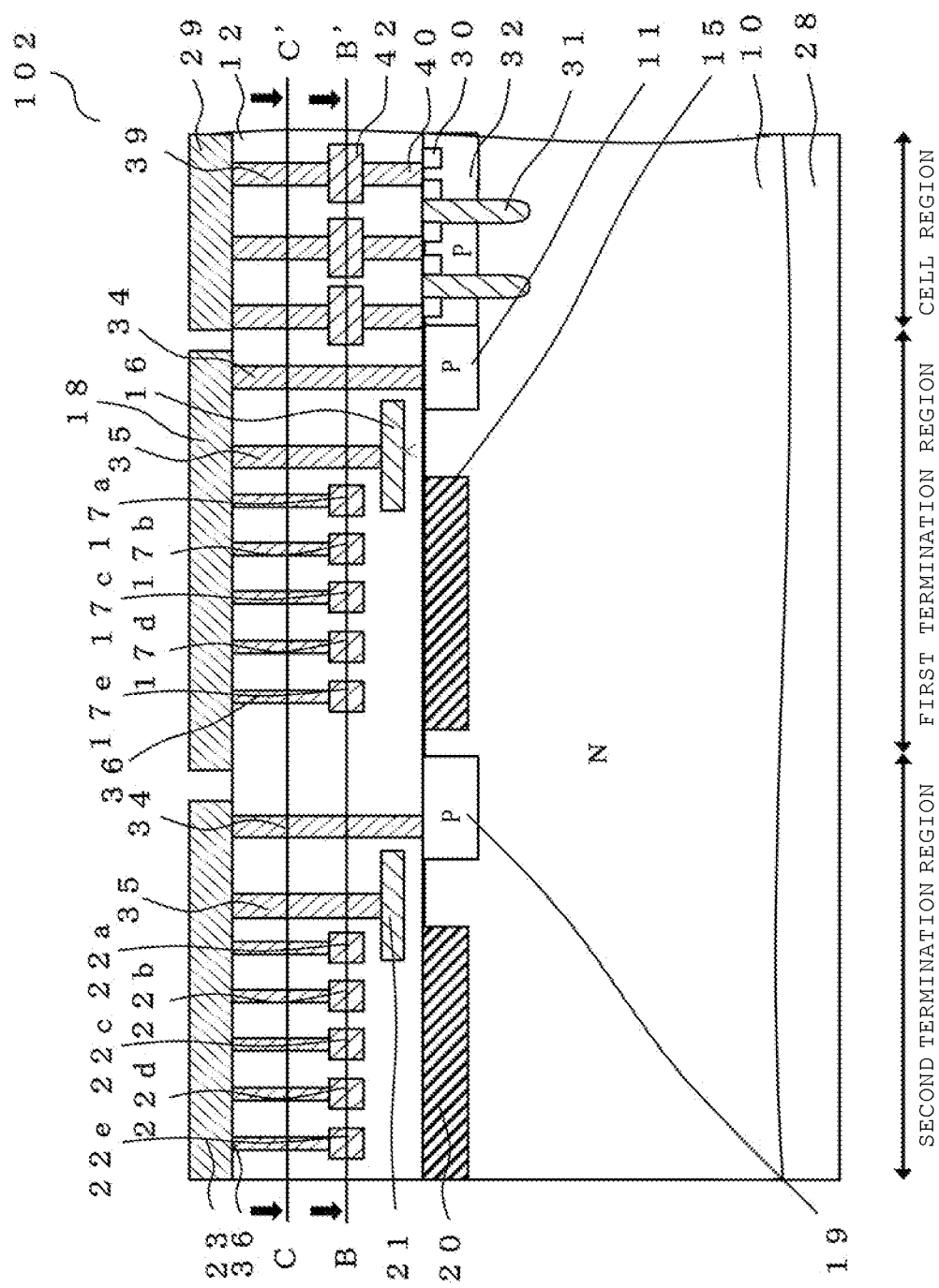
FIG. 6 is a vertical cross-sectional view of a semiconductor device according to a third embodiment.

FIG. 6 is a vertical cross-sectional view showing an example of a configuration of a semiconductor device 102 according to a third embodiment and shows the termination region provided on the exterior of the cell region and the cell region where the IGBT element is provided. In addition, FIG. 6 is a vertical cross-sectional view along line D-D' of FIG. 7 and FIG. 8.

The semiconductor device 102 differs from the semiconductor device 101 in that a first wiring layer 42, a second wiring layer 43, a fifth connection portion 39 (first connection layer), a sixth connection portion 40 (second connection layer), and a seventh connection portion 41 are provided in the cell region. The fifth connection portion 39 and the seventh connection portion 41 intersect with each other in a same horizontal plane. The first wiring layer 42 and the second wiring layer 43 intersect with each other in a same horizontal plane with each other. In addition, the fifth connection portion 39 is connected to the emitter electrode 29 and the first wiring layer 42, and the seventh connection portion 41 connect to the emitter electrode 29 and the second wiring layer 43. The sixth connection portion 40 connect to the N-type source layer 30 (fourth semiconductor layer) and the P-type body layer 32 (third semiconductor layer) at one end and the first wiring layer 42 and the second wiring layer 43 at another end.

The first wiring layer 42 and the second wiring layer 43 in the cell region, the second field plate electrodes 17a, 17b, 17c, 17d, and 17e in the first termination region, and the second field plate electrode 22a, 22b, 22c, 22d, and 22e in the second termination region are provided such that the distance from the N-type drift layer 10 is the same. That is, they may be referred to as at a same level of the device.

FIG. 7 is a transverse cross-sectional view along line B-B' line of FIG. 6. The first wiring layer 42 in the cell region, the second field plate electrodes 17a, 17b, 17c, 17d, and 17e in the first termination region, the second field plate electrodes 22a, 22b, 22c, 22d, and 22e and the second connection portion 34 and the third connection portion 35 in the second termination region are parallel to each other, that is they extend in the same direction. A transverse cross-sectional view along line C-C' of FIG. 6 is shown in FIG. 8. The fifth connection portion 39 in the cell region and the second connection portion 34, the third connection portion 35, and the fourth connection portion 36 in the first termination region and the second termination region are parallel to each other.

In the first wiring layer 42, the second wiring layer 43, the fifth connection portion 39, the sixth connection portion 40, and the seventh connection portion 41, low-resistance metal, for example, tungsten (W), copper (Cu), molybdenum (Mo), aluminum (Al), ruthenium (Ru) and the like may be used. Other structures are similar to those of the semiconductor device 101 according to the second embodiment.

Next, description will be given with regard to the operations of the semiconductor device 102. In the semiconductor device 102, for example, since the emitter electrode 29 and the N-type source layer 30 are connected to each other via the fifth connection portion 39, the seventh connection portion 41, the first wiring layer 42, the second wiring layer 43, and the sixth connection portion 40, when a positive voltage larger than a threshold voltage is applied to the gate electrode 31 in a state where a positive potential is applied to the collector electrode 28, an inversion layer is formed on the P-type body layer 32 on a side portion of the gate electrode 31 with respect to the emitter electrode 29. As a result, the semiconductor device 102 is in an ON state, and current flows. The current flows from the emitter electrode 29 to the collector electrode 28 through the, N-type source layer 30, the N-type inversion layer formed on the P-type body layer 32, and, the N-type drift layer 10.

Next, the inversion layer on the side portion of the gate electrode 31 is removed and the current from the emitter electrode 29 is interrupted by setting a voltage applied to the gate electrode 31 to zero or applying a negative voltage to the gate electrode. Thusly, the semiconductor device 102 is placed in an OFF state. The operations in the termination region are similar to those of the semiconductor device 101 according to the second embodiment.

In semiconductor device 102, when a voltage is applied between the emitter electrode 29 and the collector electrode 28, an electric field applied between the N-type source layer 30 and the N-type drift layer 10 is reduced when a resistance between the emitter electrode 29 and the N-type source layer 30 is high. For this reason, it is necessary to increase the voltage applied between the emitter electrode 29 and the collector electrode 28 to decrease an on resistance. However, when the voltage applied between the emitter electrode 29 and the collector electrode 28 is increased, since the third field plate electrode 18 in the first termination region is connected to the emitter potential, the electric field applied between the third field plate electrode 18 and the N-type drift layer 10 is increased, and an avalanche breakdown is more likely to occur in the termination region.

Since an area where the current flows is enlarged by providing the fifth connection portion 39, the seventh connection portion 41, the first wiring layer 42, the second wiring layer 43 between the emitter electrode 29 and the N-type source layer 30, it is possible to decrease an electric resistance between the emitter electrode 29 and the N-type source layer 30. For this reason, since a large electric field is applied between the N-type source layer 30 and the N-type drift layer 10, and it is not necessary to increase the voltage applied between the emitter electrode 29 and the collector electrode 28, it is possible to achieve both a low on resistance and a high breakdown voltage.

When the resistance between the emitter electrode 29 and the N-type source layer 30 is high, the resistance from the emitter electrode 29 to the collector electrode 28 is generally increased, and the on resistance increases. It is possible to decrease the on resistance between the emitter electrode 29 and the N-type source layer 30 by providing the fifth connection portion 39, the seventh connection portion 41, the first wiring layer 42, and the second wiring layer 43.

Next, description will be given with regard to a method of manufacturing the semiconductor device 102. The method of manufacturing the semiconductor device up to FIG. 4C are similar to that of the semiconductor device 101 according to the second embodiment. In this example, the first insulating layer 12 is formed by the CVD method or the like. A concave portion for forming the second connection portion 34, the third connection portion 35, the sixth connection portion 40, the first wiring layer 42, and the second wiring layer 43 and a concave portion for forming the second field plate electrodes 17a, 17b, 17c, 17d, 17e, 22a, 22b, 22c, 22d, and 22e are formed by the RIE method or the like, with a photoresist or the like serving as the etch mask.

Figure 9A:
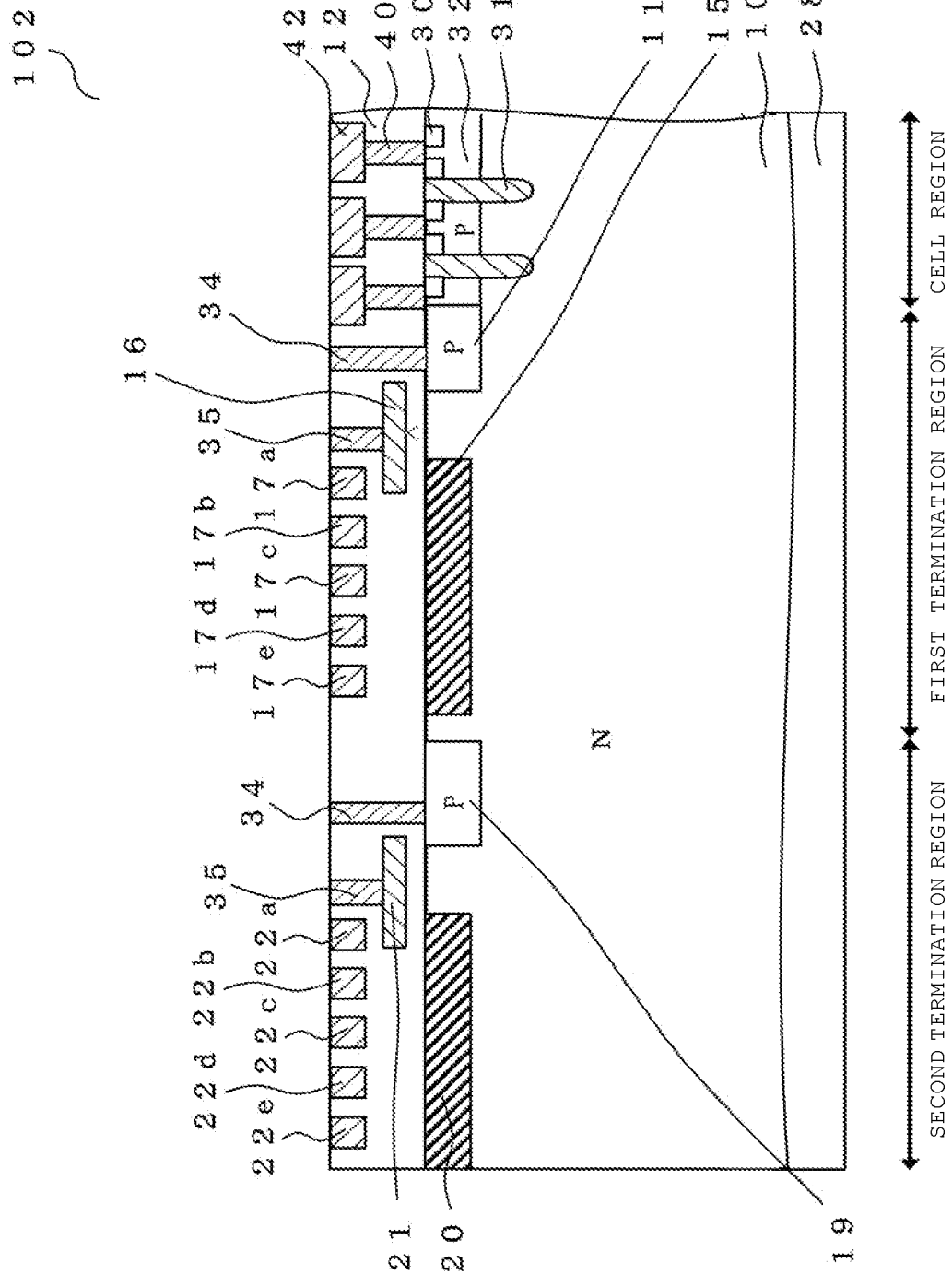
FIGS. 9A to 9C are schematic cross-sectional views of the semiconductor device during the manufacturing process of the semiconductor device according to the third embodiment.

As shown in FIG. 9A, a low-resistance metal is embedded to the second connection portion 34, the third connection portion 35, the sixth connection portion 40, the first wiring layer 42, the second wiring layer 43, the second field plate electrodes 17a, 17b, 17c, 17d, 17e, 22a, 22b, 22c, 22d, and 22e by a CVD method or the like and the deposited metal is flattened by a CMP method or the like.

Figure 9B:
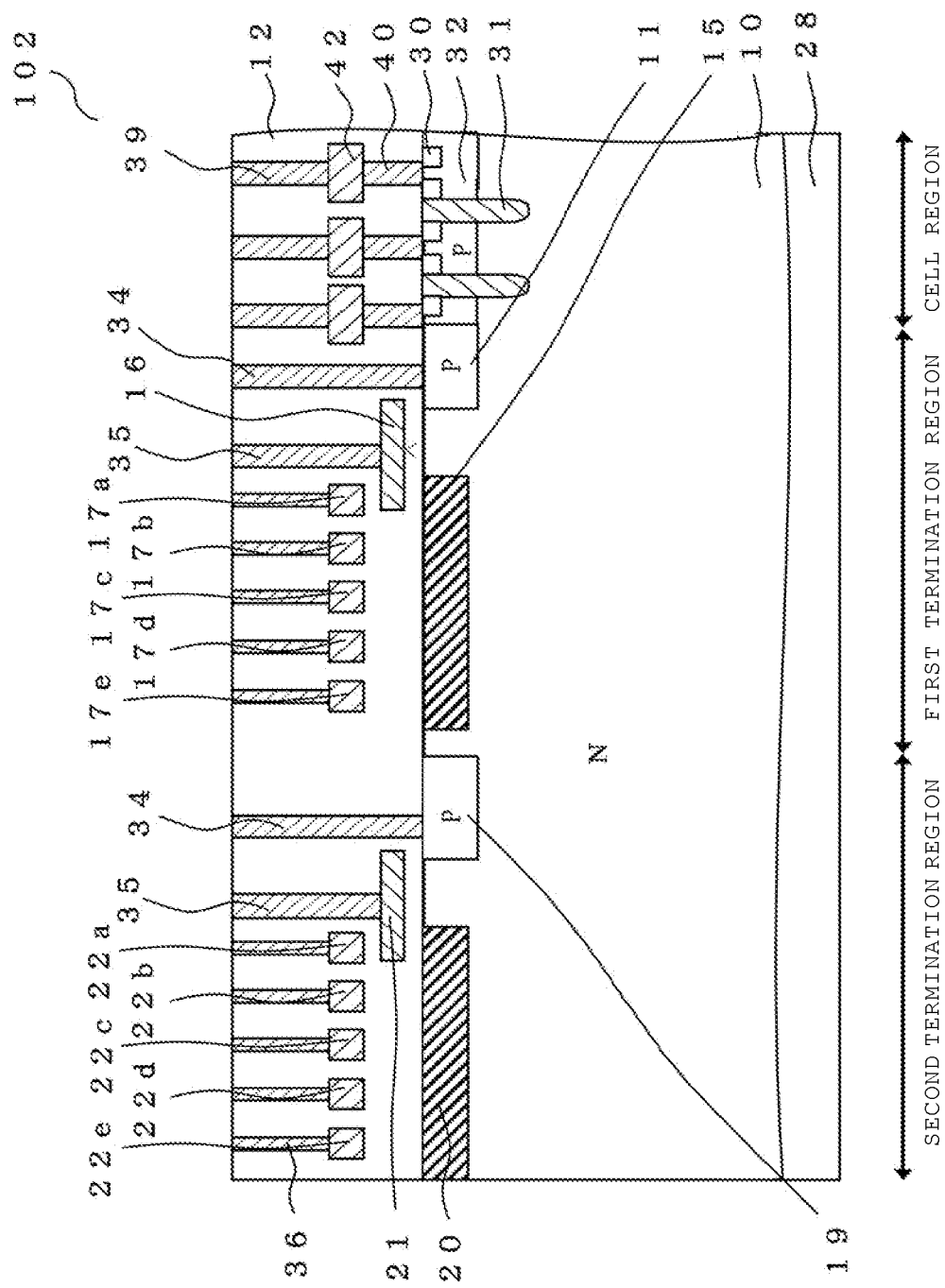

Next, the first insulating layer 12 is formed by a CVD method or the like. The second connection portion 34, the third connection portion 35, the fifth connection portion 39, and the seventh connection portion 41 are formed by a RIE method or the like, with a photoresist as the mask. As shown in FIG. 9B, the low-resistance metal is embedded in the second connection portion 34, the third connection portion 35, the fifth connection portion 39, the seventh connection portion 41 by a CVD method or the like, and is then flattened by a CMP method or the like.

Figure 9C:
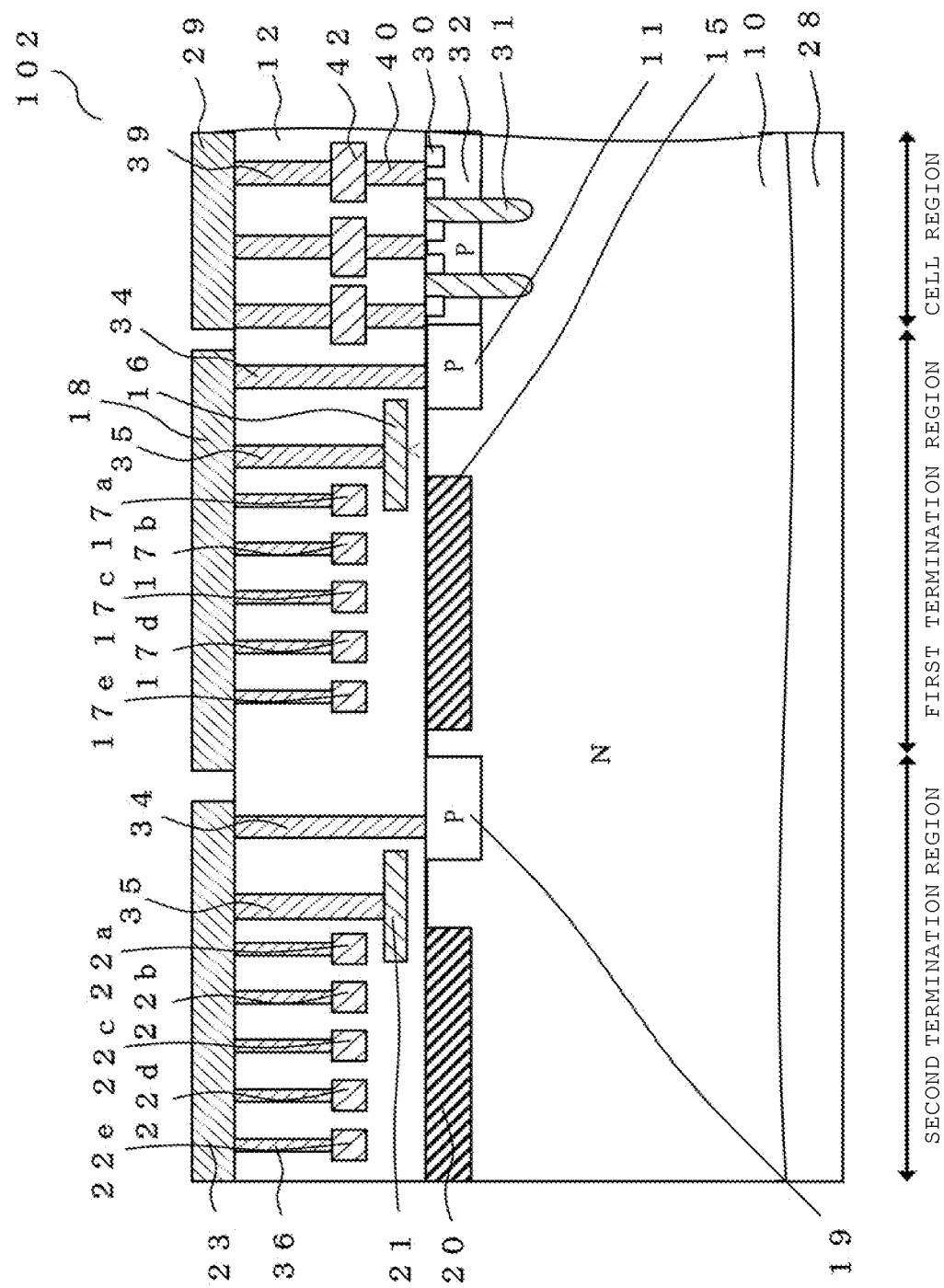

The layers of the third field plate electrodes 18 and 23 and the emitter electrode 29 are formed by a sputtering method or the like. The third field plate electrodes 18 and 23 and the emitter electrode 29 may be formed by selectively etching, by a RIE method or the like, using a photoresist or the like as an etch mask, and the shape depicted in FIG. 9C can be obtained such that the third field plate electrodes 18 and 23 and the emitter electrode 29 are in a desired locations. The semiconductor device 102 may thus be manufactured by the processes depicted in FIGS. 4A to 4C and FIGS. 9A to 9C.

(Fourth Embodiment)

Hereinafter, description will be given with regard to a semiconductor device 103 according to a fourth embodiment. Moreover, with regard to the fourth embodiment, description with regard to the same points as the third embodiment will be omitted, and description will be given with regard to only different points. FIG. 10 is a vertical cross-sectional view showing an example of the configuration of the semiconductor device 103 according to the fourth embodiment and shows the termination region provided on the exterior of the cell region and the cell region where the IGBT element is provided. In addition, FIG. 10 is a vertical cross-sectional view along line G-G' of FIG. 11 and FIG. 12.

The different points of the semiconductor device 103 from the semiconductor device 102 according to the third embodiment are that a second field plate electrode 44 and an eighth connection portion 46 are provided to the first termination region, and a second field plate electrode 45 and a ninth connection portion 47 are provided to the second termination region.

Figure 11:
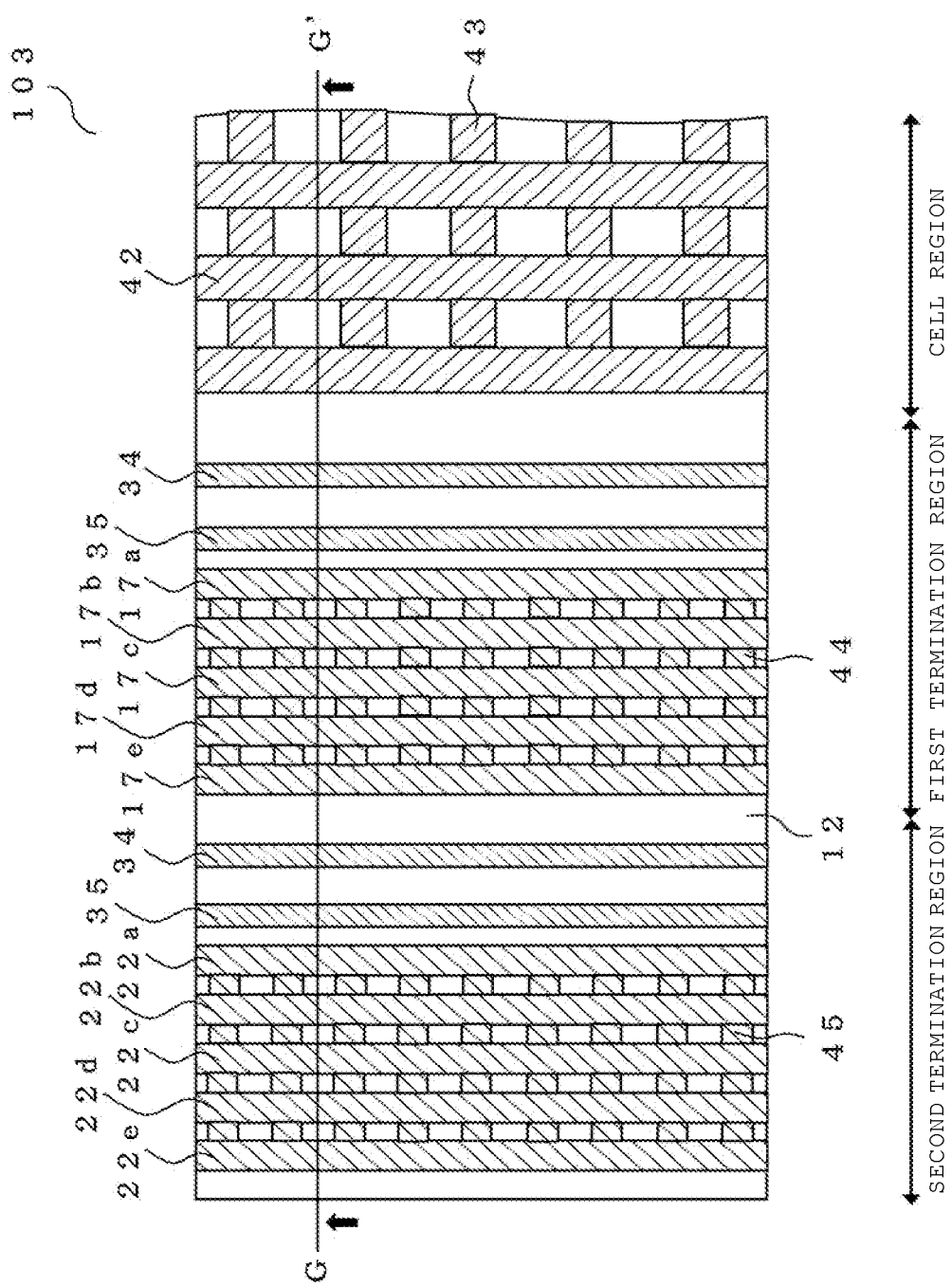
FIG. 11 is a transverse cross-sectional view along line E-E' of FIG. 10.
Figure 12:
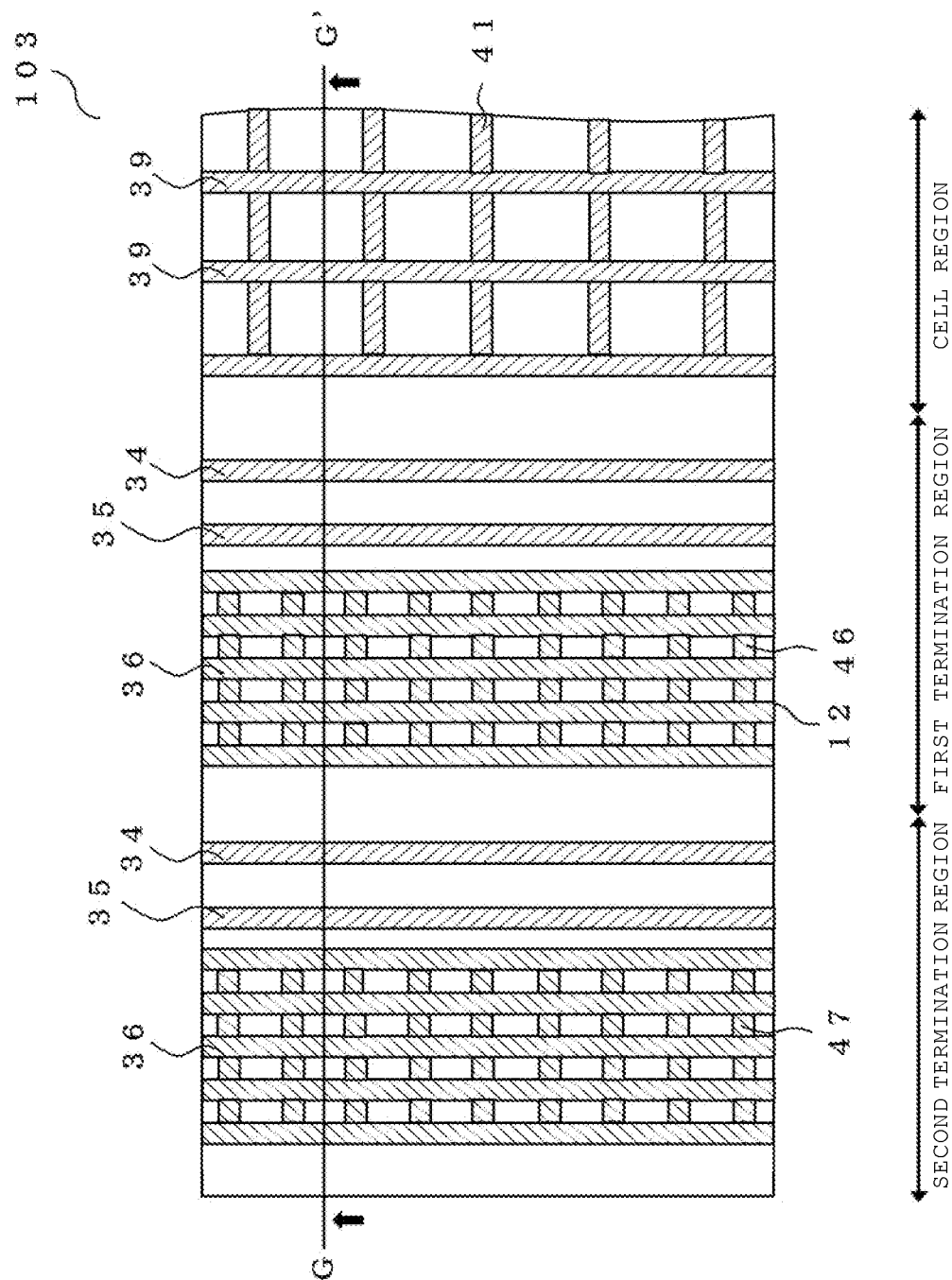
FIG. 12 is a transverse cross-sectional view along line F-F' of FIG. 10.

A transverse cross-sectional view along line E-E' of FIG. 10 is shown in FIG. 11. The second field plate electrode 44 intersects with the second field plate electrode 17a, 17b, 17c, 17d, and 17e, and the second field plate electrode 45 intersects with the second field plate electrode 22a, 22b, 22c, 22d, and 22e. A transverse cross-sectional view along line F-F' of FIG. 10 is shown in FIG. 12. The eighth connection portion 46 intersects with the fourth connection portion 36, and the ninth connection portion 47 intersects with the fourth connection portion 36.

The operations of the semiconductor device 103 are similar to those of the semiconductor device 102.

In semiconductor device 103, is possible to expand the depletion layer also in a direction perpendicular to the direction in which the second field plate electrode 44 and the second field plate electrode 45 extend in a stepwise manner by providing the second field plate electrode 44 and the second field plate electrode 45. For this reason, since the electric field concentration is suppressed without generating a large electric field concentration in one place, it is possible to obtain a large breakdown voltage in the termination region.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
    a first semiconductor region having a first conductivity type and including a cell region;
    a second semiconductor region having a second conductivity type, the second semiconductor region disposed on a first portion of a surface of the first semiconductor region and surrounding the cell region;
    a third semiconductor region having the second conductivity type, the third semiconductor region on a second portion of the surface of the first semiconductor region and surrounding the cell region, the second portion spaced from the first portion and disposed such that the first portion is between the second portion and the cell region;
    a first insulating layer on the first semiconductor region, the second semiconductor region, and the third semiconductor region;
    a first field plate electrode having a first portion at a first distance, greater than zero, from the surface of the first semiconductor region in a first direction orthogonal to the surface, the first insulating layer being between the first field plate electrode and the surface of the first semiconductor region in the first direction;
    a second field plate electrode having at least a second portion at a second distance greater than the first distance from the surface of the first semiconductor region in the first direction, the first insulating layer being between the second field plate electrode and the surface of the first semiconductor region in the first direction;
    a third field plate electrode having at least a third portion at a third distance greater than the second distance, from the surface of the first semiconductor region in the first direction, the first insulating layer being between the second field plate electrode and the surface of the first semiconductor region in the first direction; and
    a gate electrode in the cell region of the first semiconductor layer configured to control electrical conductance between an emitter electrode and a collector electrode, wherein
    the third field plate electrode is electrically connected to the second semiconductor region, the first field plate electrode, and the second field plate electrode, and
    the third field plate electrode is electrically connected to the emitter electrode such that the third field plate electrode is at a same potential as the emitter electrode.

2. The semiconductor device according to claim 1, further comprising:
    a fourth field plate electrode having a first portion at the first distance in the first direction from the surface of the first semiconductor region;
    a fifth field plate electrode having at least a portion at the second distance in the first direction from the surface of the first semiconductor region; and
    a sixth field plate electrode having at least a portion at the third distance in the first direction from the surface of the first semiconductor region,
    wherein the sixth field plate electrode is electrically connected to the third semiconductor region, the fourth field plate electrode, and the fifth field plate electrode, and
    the sixth field plate electrode has a floating potential.

3. The semiconductor device according to claim 1, wherein electrical connections in the first direction between the emitter electrode and the first semiconductor layer are made via a connection portion having a first portion extending in the second direction and a second portion extending in the third direction to form a grid in the first insulating layer.

4. The semiconductor device according to claim 3, wherein, at a same level in the first insulating layer as the second field plate electrode, the connection portion is wider in the second direction than at levels in the first insulating layer above and below the second field plate electrode in the first direction.

5. The semiconductor device according to claim 1, wherein
    at least some portion of the second field plate electrode is above the first field plate electrode, and
    at least some portion of the first field plate electrode is above the second semiconductor region.

* * * * *